United States Patent
Engelhart et al.

(10) Patent No.: US 9,029,690 B2
(45) Date of Patent: May 12, 2015

(54) SEMICONDUCTOR DEVICE, IN PARTICULAR SOLAR CELL

(75) Inventors: Peter Engelhart, Hameln (DE); Robert Seguin, Berlin (DE); Wilhelmus Mathijs Marie Kessels, Tilburg (NL); Gijs Dingemans, Tilburg (NL)

(73) Assignee: Q-Cells SE, Bitterfeld-Wolfen (DE)

( * ) Notice: Subject to any disclaimer, the term of this patent is extended or adjusted under 35 U.S.C. 154(b) by 548 days.

(21) Appl. No.: 13/118,673

(22) Filed: May 31, 2011

(65) Prior Publication Data

US 2011/0290318 A1 Dec. 1, 2011

(30) Foreign Application Priority Data

May 31, 2010 (DE) .......................... 10 2010 017 155

(51) Int. Cl.
*H01L 31/00* (2006.01)
*H01L 31/0216* (2014.01)
*H01L 31/055* (2014.01)

(52) U.S. Cl.
CPC ........... *H01L 31/02168* (2013.01); *Y02E 10/50* (2013.01); *H01L 31/02167* (2013.01); *H01L 31/055* (2013.01)

(58) Field of Classification Search
USPC ....................................................... 136/256
See application file for complete search history.

(56) References Cited

U.S. PATENT DOCUMENTS

| | | | |
|---|---|---|---|
| 5,270,267 A | 12/1993 | Ouellet | |
| 5,952,084 A | 9/1999 | Anderson | |
| 2001/0031365 A1 | 10/2001 | Anderson | |
| 2003/0169968 A1* | 9/2003 | Bazylenko et al. | 385/43 |
| 2005/0030629 A1* | 2/2005 | Kursawe et al. | 359/586 |
| 2005/0032341 A1* | 2/2005 | Koezuka et al. | 438/513 |
| 2005/0118827 A1* | 6/2005 | Sato et al. | 438/700 |
| 2006/0046522 A1 | 3/2006 | Ahn | |
| 2007/0169808 A1* | 7/2007 | Kherani et al. | 136/258 |
| 2007/0295390 A1 | 12/2007 | Sheats | |
| 2008/0072959 A1* | 3/2008 | Chen et al. | 136/257 |
| 2008/0308143 A1 | 12/2008 | Atanackovic | |
| 2009/0165849 A1* | 7/2009 | Chan et al. | 136/256 |
| 2009/0183774 A1 | 7/2009 | Atanackovic | |
| 2010/0015749 A1 | 1/2010 | Borden | |
| 2010/0038521 A1 | 2/2010 | Clark | |

FOREIGN PATENT DOCUMENTS

| | | | |
|---|---|---|---|
| EP | 2154727 A2 | 5/2011 | |
| WO | WO2005004198 A2 | 1/2005 | |
| WO | WO2006097303 A1 | 3/2007 | |
| WO | WO2009062882 A2 | 5/2009 | |

OTHER PUBLICATIONS

Benjamin W. Schmidt et al, "Metal-organic chemical vapor deposition of aluminum oxide thin films via pyrolysis of dimethylaluminum isopropoxide", J. Vac. Sci. Technol. A 28(2), Mar./Apr. 2010, pp. 238-243, published Jan. 22, 2010.

M.C. Ntsama-Etoundi, J.Desmaison, P.Tristant, C.Tixier, "Remote microwave plasma enhanced chemical vapour deposition of alumina on metallic substrates", Surface and Coating Technology 120-121 (1999) pp. 233-237.

Bram Hoex, "Functional thin films for high-efficiency solar cells", May 8, 2008.

Pierre Saint-Cast, et al., "Very low surface recombination velocity on p-type c-Si by high-rate plasma-deposited aluminum oxide." Applied Physics Letter 95, 151502 (2009), 3 pages, American Institute of Physics.

G. Dingemans, et al., "Stability of Al2O3 and Al2O3/a—SiNx: H stacks for surface passivation of crystalline silicon." Journal of Applied Physics 106, 114907 (2009) 4 pages, American Institute of Physics.

Xiao Hai-Qing, et al., "Excellent Passivation of p-Type Si Surface by Sol-Gel Al2O3 Films." Chin. Phys. Lett. vol. 26, No. 8 (2009) pp. 088102-1 to 088102-4, Chinese Physical Society and IOP Publishing Ltd.

Shinsuke Miyajima, et al., "High Quality Oxide Passivation Layer for Crystalline Silicon Solar Cells Deposited by Parallel-Plate Plasma-Enhanced Chemical Vapor Deposition." Applied Physics Express 3 (2010), pp. 012301-1 to 012301-3, The Japan Society of Applied Physics.

G. Dingemans, et al. "Firing Stability of Atomic Layer Deposited Al2O3 for c-Si Surface Passivation." In proceeding of: Photovoltaic Specialists Conference (PVSC), 2009 34th IEEE Source: IEEE Xplore.

G.L. Harding, "Production and Properties of High Rate Sputtered Low Index Transparent Dielectric Material Based on Aluminium—Oxy—Flourine." Solar Energy Material 12 (1985), pp. 169-186, North-Holland, Amsterdam.

K. Baumgartner, et al., "Optical Properties of Magnetron Sputtered Thin Dielectric Films Containing Terbuim (III) for Spectral Conversion in Thin film Solar Cells." pp. 354-358, 24th European Photovoltaic Solar Energy Conference, Sep. 21-25, 2009, Hamburg, Germany.

A. Polman, "Erbium Implanted Thin Film Photonic Materials." Applied Physics Reviews, J. Appl. Phys. 82 (1), Jul. 1, 1997, pp. 1-39, American Institute of Physics.

P.Vitanov, et al., "A Study of Sol-Gel Deposited AL2O3 Films as Passivation Coatings for Solar Cells Application." pp. 1596-1599, 23rd European Photovoltaic Solar Energy Conference, Sep. 1-5, 2008, Valencia, Spain.

(Continued)

*Primary Examiner* — Eli Mekhlin

(74) *Attorney, Agent, or Firm* — William J. Sapone; Ware Fressola; Maguire & Barber LLP

(57) ABSTRACT

A semiconductor device, in particular a solar cell, comprises a semiconductor substrate having a semiconductor substrate surface and a passivation composed of at least one passivation layer which surface-passivates the semiconductor substrate surface, wherein the passivation layer comprises a compound composed of aluminum oxide, aluminum nitride or aluminum oxynitride and at least one further element.

11 Claims, No Drawings

(56) References Cited

OTHER PUBLICATIONS

Mikko Ritala, "Advanced ALE Processes of Amorphous and Polycrystalline Films." Applied Surface Science 112 (1997), pp. 223-230, Elsevier Science B.V.

Steven M. George, "Atomic Layer Depostion: An Overview." Chem. Rev. 2010, 110, pp. 111-131, American Chemical Society (2010) (Published on web Nov. 30, 2009).
European Search report for related European Application, EP 2390921 A3, published Apr. 9, 2014, 11 pages.

* cited by examiner

SEMICONDUCTOR DEVICE, IN PARTICULAR SOLAR CELL

TECHNICAL FIELD

The invention relates to a semiconductor device, in particular a solar cell.

BACKGROUND

One of the limiting factors for the efficiency of semiconductor components and devices is the recombination of charge carriers at semiconductor surfaces which have surface states that promote the recombination activity. This problem is of importance particularly in solar cells. This is because in this case the recombined charge carriers are no longer available for generating current. In order to reduce recombinations, the semiconductor surface has to be passivated by decreasing the recombination activity of charge carriers by means of surface states.

For the passivation of semiconductor surfaces, at the present time aluminium oxide is used diversely ($Al_2O_3$ or $AlO_x$, which very generally is taken to mean any suitable stoichiometric composition of aluminium and oxygen). Aluminium oxide has a high negative surface charge density and, if applied to the semiconductor surface indirectly by way of an intermediate layer or directly, can displace charge carriers from the semiconductor surface into the semiconductor volume. On account of this field-effect-passivating effect, the semiconductor surface is effectively passivated.

Such passivation layers composed of aluminium oxide have the disadvantage, however, that they are not resistant to specific production processes, particularly in the production of solar cells, for example to wet-chemical cleaning or etching processes. Therefore, they have to be protected by means of additional covering layers. This leads to higher production costs and longer production times.

Furthermore, particularly in the case of solar cells, not only is it necessary to take account of the electrical properties of the layer sequences, but it is also necessary for the optical properties of the individual layers to be coordinated with one another. However, if only aluminium oxide is used as material of the passivation layer, then the design of the solar cell is fixed to a specific refractive index (namely approximately 1.6).

SUMMARY OF THE INVENTION

Therefore, it is an object of the invention to provide a semiconductor device, in particular a solar cell, which can be produced with lower expenditure in respect of costs and time and has an effective passivation that is simultaneously resistant to production process steps.

The object is achieved according to the invention by means of a semiconductor device, in particular solar cell, comprising a semiconductor substrate having a semiconductor substrate surface and a passivation composed of at least one passivation layer which surface-passivates the semiconductor substrate surface, wherein the passivation layer comprises a compound composed of aluminium oxide, aluminium nitride or aluminium oxynitride and at least one further element. Advantageous developments of the invention are discussed further below.

DETAILED DESCRIPTION OF THE INVENTION

The semiconductor device is preferably a solar cell, in which an improved surface passivation of the semiconductor substrate surface leads to a more efficient conversion of incident light into electric current. However, a good surface passivation can also be of importance in other areas of semiconductor technology. The surface passivation described here can be employed in the case of solar cells on the front side, that is to say on the light incidence side of the solar cell, on the rear side, that is to say on the light-remote side of the solar cell, or on both sides. The semiconductor substrate is advantageously formed from silicon. The semiconductor substrate can comprise a semiconductor wafer.

The invention is based on the insight that, by means of the addition of additional elements to an aluminium oxide compound of a passivation layer, the chemical, electrical and/or optical properties thereof can be optimized. This holds true both with regard to the surface passivation and with regard to further functional tasks which can be performed by the passivation layer on the semiconductor device during and/or after its production.

For this purpose, a compound containing aluminium oxide, aluminium nitride or aluminium oxynitride and at least one further element which is not aluminium is used as material for the passivation layer. The chemical formula for such a material can generally be noted as $Al_xM_mO_y$, $Al_xM_mN_z$ or $Al_xM_mO_yN_z$, a desired stoichiometric ratio being obtained by a suitable choice of x, y, z and, if appropriate, m. In this case, M denotes the further element. In the last case, $Al_xM_mO_yN_z$, if M denotes a further metal element, the refractive index of the material can be set for example by a suitable choice of the stoichiometric ratio, to be precise from approximately 1.6 for z=0 up to approximately 2.0 for y=0.

By means of the addition of the further element, therefore, the refractive index of the passivation layer can be altered in order to be able to additionally use the passivation on the semiconductor device for optical functions, in particular by means of targeted influencing of its reflection and/or absorption behaviour. The refractive index values mentioned in the present case relate to measurements in the visible light spectrum.

It should be pointed out that the further element can be a compound partner with respect to aluminium oxide, aluminium nitride or aluminium oxynitride only when the further element is contained stoichiometrically significantly in the passivation layer. In other words, natural contaminations with the further element which inevitably occur during the production process are not involved in this case. Expediently, the density of the further element in the material of the passivation layer is at least 1 atomic percent (at %). Preferably, the further element in the material of the passivation layer has a density of at least approximately 2 at %, 5 at %, 8 at %, 10 at %, 15 at % or 20 at %.

One preferred embodiment provides for the compound of the passivation layer to comprise nitrogen, carbon, phosphorus, boron and/or fluorine as a further element. A higher stability, in particular chemical stability, can possibly be expected when nitrogen is added or aluminium oxynitride ($Al_xO_yN_z$) is used for the production of the passivation layer. This effect is already known when nitrogen is added to silicon oxide layers.

While the refractive index of the passivation layer is increased by the addition of nitrogen, it is reduced by means of the addition of fluorine. Aluminium fluoride has, for example, a refractive index of approximately 1.4. Moreover, the chemical resistance of the passivation layer can be increased by means of doping by boron or phosphorus. Furthermore, a passivation layer doped in this way can serve as a source for selectively doping an underlying semiconductor layer, for example by means of laser doping.

Further properties of the passivation layer can be influenced by means of the incorporation of carbon into the aluminium oxide. For example, the carbon concentration can be manipulated in a targeted manner by means of the setting of the semiconductor substrate temperature during a deposition of the passivation layer. A lower temperature leads to a higher carbon concentration in the passivation layer. The carbon concentration in the passivation layer can alternatively or cumulatively be influenced by means of the use of a carbon dioxide plasma.

One advantageous development provides for the compound of the passivation layer to comprise a metal as a further element. In particular, one expedient configuration provides for the compound of the passivation layer to comprise a rare earth metal as a further element.

By way of example, the effect of up-conversion can be used by means of the admixture of a suitable amount of optically active elements such as erbium ions (Er3+), for example. In this case, from two long-wave photons which cannot be absorbed by the solar cell, one short-wave photon is generated, which is then available for obtaining current by absorption in the semiconductor. Generally, by means of the admixture of erbium, ytterbium or terbium in the form of atoms or ions, the spectral conversion (up-conversion, down-conversion or shift) can be improved and, at the same time, a high surface passivation of the semiconductor substrate surface can be guaranteed.

Moreover, there are indications that the crystallization temperature is increased by the incorporation of a small amount of erbium into aluminium oxide. It is assumed that this effect is also manifested for other elements. Generally, an increased thermal stability can be derived therefrom on account of the crystallization. This is of importance particularly in the metallization of solar cells, if the solar cell is in this case subjected to a thermal treatment, also called firing step.

It is preferably provided that the passivation layer is arranged directly on the semiconductor substrate surface. In other words, in this embodiment, there is no further layer situated between passivation layer and semiconductor substrate surface. In all the embodiments described here, the semiconductor substrate surface can have differently doped regions, for example in order to form base and emitter regions in the semiconductor substrate.

One expedient embodiment provides for the passivation to comprise one or more further passivation layers arranged between the passivation layer and the semiconductor substrate surface. By way of example, a chemically passivating further passivation layer can be applied directly to the semiconductor substrate surface. This further passivation layer can be produced by means of oxidation of the semiconductor substrate surface or advantageously by means of a deposition process.

One advantageous configuration provides for the passivation to comprise at least one further passivation layer arranged on a side of the passivation layer which is remote from the semiconductor substrate surface.

One preferred development provides for the passivation to comprise an alternating layer sequence composed of the passivation layer and a further passivation layer. In this case, the layer sequence preferably comprises between 2 and 1000 passivation layers, preferably at least 10 or at least 100 passivation layers. Examples thereof form a layer sequence composed of titanium oxide and aluminium oxide ($TiO_2/AlO_x/TiO_2/AlO_x/TiO_2/AlO_x$ . . . ) or a layer sequence composed of silicon oxide and aluminium oxide ($SiO_2/AlO_x/SiO_2/AlO_x/SiO_2/AlO_x$ . . . ). Each of the passivation layers from which the passivation is formed is preferably a monolayer composed of the respective material, a larger number of monolayers per passivation layer also being possible, for example 5, 10 or more monolayers.

Since the individual partial layers/monolayers can have different visible, optical and/or electrical properties from the bulk material, such a multilayer stack does not behave like a layer stack composed of two bulk materials. Furthermore, the optical property of the multilayer system changes with very thin individual layers. Thus, it is known, for example, that with alternating layers composed of aluminium oxide and titanium oxide it is possible to produce a so-called nanolaminate, in which, by means of the layer thickness ratio between the two partial layers, the total or global refractive index of the laminate can be set in a continuously variable manner between 1.6 (refractive index of aluminium oxide) and 2.4 (refractive index of titanium dioxide).

In order to produce the passivation layers described here by means of deposition processes, the different elements can be added to the starting substances during deposition. Both chemical and physical vapour deposition methods are suitable for the deposition, which methods can preferably proceed in a plasma-enhanced fashion. Wet-chemical deposition methods may also be used.

It is advantageously provided that the passivation layer is a layer deposited by atomic layer deposition. To put it another way, the passivation layer is applied, during production, by means of atomic layer deposition (ALD), which, if appropriate, is plasma-enhanced. In this case, the incorporation of further elements can be performed in a targeted manner by said elements being directed cyclically to the starting substances or plasma gases in the deposition reactor. The cyclic deposition additionally allows a gradual change in layer properties such as refractive index, for example, perpendicularly to the layer surface. This is advantageous, for example, for an optical adaptation on the light incidence side of a solar cell. Moreover, by means of a gradual alteration of process parameters, the process speed can be optimized since the density of the passivation layer can change in this case, which influences the deposition rate.

One preferred configuration provides for the passivation layer to be designed as an antireflection layer, as a reflection layer or as part of such a layer. The passivation layer can also perform other functions, in particular including functions during the production of the semiconductor device. It can act for example as an etching, texture and/or diffusion barrier.

The result of a process of depositing a passivation layer composed of aluminium oxynitride ($Al_xO_yN_z$) is described below as an exemplary embodiment. A plasma-enhanced atomic layer deposition method was used, with a plasma power of approximately 150 W and a chamber pressure of approximately 170 mtorr, wherein the substrate was kept at a temperature of 200° C. Trimethylaluminium (TMA) with a dose time of 20 ms was used as aluminium precursor. Argon was introduced into the reaction chamber with a gas volumetric flow rate of 20 standard cubic centimeters per minute (sccm). The deposition time was 3.5 seconds. Of these parameters, three deposition processes each with different gas concentrations for nitrogen ($N_2$) and oxygen ($O_2$) were carried out, as a result of which the layers thus formed have different refractive indices and growth rates.

At gas volumetric flow rates of 10 sccm for $N_2$ and 40 sccm for $O_2$, this gave rise to an aluminium oxynitride layer at a growth rate of approximately GPC=0.36 nm (GPC: growth per cycle), with a refractive index of approximately n=1.57.

At gas volumetric flow rates of 25 sccm for $N_2$ and for 25 sccm for $O_2$, this gave rise to an aluminium oxynitride layer at a growth rate of approximately GPC=0.33 nm with a refractive index of approximately n=1.59.

At gas volumetric flow rates of 40 sccm for $N_2$ and for 10 sccm for $O_2$, this gave rise to an aluminium oxynitride layer at a growth rate of approximately GPC=0.29 nm with a refractive index of approximately n=1.63.

Layers formed without the addition of oxygen only had a growth rate of approximately GPC=0.06 nm.

The invention claimed is:

1. A solar cell, comprising a semiconductor substrate having a semiconductor substrate surface and a passivation composed of at least one passivation layer which surface passivates the semiconductor substrate surface, wherein:
   a) the passivation layer consists essentially of a compound containing aluminium oxide, aluminium nitride or aluminium oxynitride according to a formula of $Al_xM_mO_y$, $Al_xM_mN_z$ or $Al_xM_mO_yN_z$, where M is carbon, m, x, y and z being greater than 0, with M present in the passivation layer in a stoichiometrically significant amount, or,
   b) the passivation layer consists essentially of a compound containing aluminium nitride or aluminium oxynitride according to a formula of $Al_xM_mN_z$ or $Al_xM_mO_yN_z$, where M is fluorine, m, x, y and z being greater than 0, with M present in the passivation layer in a stoichiometrically significant amount, or,
   c) the passivation layer consists essentially of a compound containing aluminium oxide, aluminium nitride or aluminium oxynitride according to a formula of $Al_xM_mO_y$, $Al_xM_mN_z$ or $Al_xM_mO_yN_z$, where M is phosphorus or boron, m, x, y and z being greater than 0, with M present in the passivation layer in a stoichiometrically significant amount.

2. The solar cell according to claim 1, wherein the passivation layer is arranged directly on the semiconductor substrate surface.

3. The solar cell according to claim 1, wherein the passivation further comprises one or more further passivation layers arranged between the passivation layer and the semiconductor substrate surface.

4. The solar cell according to claim 3, wherein at least one further passivation layer is arranged on a side of the passivation layer which is remote from the semiconductor substrate surface.

5. The solar cell according to claim 3, wherein the passivation is comprised of an alternating layer sequence composed of the passivation layer and a further passivation layer.

6. The solar cell according to claim 1, wherein the passivation layer is deposited by atomic layer deposition.

7. The solar cell according to claim 1, wherein the passivation layer is an antireflection layer.

8. The solar cell according to claim 1 wherein the passivation layer is a reflection layer.

9. The solar cell of claim 1 further comprising an antireflection layer, the passivation layer being a part thereof.

10. The solar cell of claim 1 further comprising a reflection layer, the passivation layer being a part thereof.

11. The solar cell of claim 1 wherein a density of M in the passivation layer is at least 1 atomic percent.

* * * * *